United States Patent
Sin et al.

(10) Patent No.: US 7,012,832 B1
(45) Date of Patent: Mar. 14, 2006

(54) MAGNETIC MEMORY CELL WITH PLURAL READ TRANSISTORS

(75) Inventors: Kyusik Sin, Pleasanton, CA (US); Matthew R. Gibbons, Dublin, CA (US); William D. Jensen, Cranberry Township, PA (US); Hugh Craig Hiner, Fremont, CA (US); Xizeng Stone Shi, Fremont, CA (US); Roberto Bez, Milan (IT); Giulio Casagrande, Milan (IT); Paolo Cappelletti, Milan (IT)

(73) Assignees: WEstern Digital (Fremont), Inc., Lake Forest, CA (US); STMicroelectronics, S.r.I., Agrate Brianza (IT)

( * ) Notice: Subject to any disclaimer, the term of this patent is extended or adjusted under 35 U.S.C. 154(b) by 0 days.

(21) Appl. No.: 10/698,747

(22) Filed: Oct. 31, 2003

(51) Int. Cl.
*G11C 11/00* (2006.01)

(52) U.S. Cl. .................. 365/158; 365/50; 365/173

(58) Field of Classification Search ............... 365/158, 365/50, 154, 171, 173, 189.01
See application file for complete search history.

(56) References Cited

U.S. PATENT DOCUMENTS

| 5,930,164 A * | 7/1999 | Zhu ............................ 365/158 |
| 6,717,844 B1 * | 4/2004 | Ohtani ....................... 365/158 |
| 6,747,301 B1 * | 6/2004 | Hiner et al. ................ 257/295 |
| 6,775,183 B1 * | 8/2004 | Heide ......................... 365/173 |
| 2004/0066668 A1 * | 4/2004 | Gider et al. ................ 365/171 |
| 2005/0002229 A1 * | 1/2005 | Matsutera et al. .......... 365/171 |

* cited by examiner

*Primary Examiner*—Richard Elms
*Assistant Examiner*—Dang T. Nguyen
(74) *Attorney, Agent, or Firm*—Sawyer Law Group LLP

(57) ABSTRACT

A magnetic random access memory (MRAM) device has increased ΔR/R for sensing a state of a pin-dependent tunneling (SDT) device. The MRAM device includes plural transistors connected to a read line for sensing the state of the SDT device. Plural transistors lower an underlying resistance during reading, increasing ΔR/R. The plural transistors can share a source region.

30 Claims, 4 Drawing Sheets

MAGNETIC MEMORY CELL WITH PLURAL READ TRANSISTORS

TECHNICAL FIELD

This invention relates to solid state memory such as magnetic random access memory (MRAM) that may, for example, be employed in computers, consumer electronics and other digital processing systems.

BACKGROUND

Spin-dependent tunneling (SDT) effects are believed to depend upon a quantum mechanical probability of electron tunneling from one ferromagnetic (FM) electrode to another through a thin, electrically nonconductive layer, with the probability of tunneling depending upon the direction of magnetization of one electrode relative to the other. SDT effects have many potential applications in magnetic field sensing devices, such as magnetic field sensors and information storage and retrieval devices. Read transducers for magnetic heads used in disk or tape drives, which may be termed magnetoresistive (MR) sensors, and solid-state memory devices such as magnetic random access memory (MRAM), are potential commercial applications for spin tunneling effects.

SDT devices typically include two FM electrodes and an electrically insulating tunneling barrier. One of the electrodes may include a pinned ferromagnetic layer and the other may include a free ferromagnetic layer. The pinned layer typically consists of a FM layer that has its magnetic moment stabilized by a pinning structure. The pinning structure may be an antiferromagnetic (AFM) layer that adjoins the pinned layer. The magnetic stabilization can be enhanced by using a synthetic AFM structure as the pinned layer. The synthetic AFM structure includes a transition metal such as ruthenium (Ru) in a sandwich between two FM layers, in which the transition metal layer has a precisely defined thickness that is typically less than 10 Å. The magnetization direction of the pinned FM layer may be after deposition by annealing in a magnetic field. The free layer is typically a magnetically soft FM layer. The tunneling barrier may be made of a thin dielectric layer, such as $Al_2O_3$ or AlN, which has a thickness typically in a range between 0.5 nm and 2 nm.

FIG. 1 shows a top view and FIG. 2 shows a cross-sectional view of a prior art MRAM device. SDT cells 20 and 22 are connected to an electrically conductive bit line 30, and SDT cells 24 and 26 are connected to another electrically conductive bit line 33. SDT cell 24 includes a ferromagnetic (FM) free layer 35 separated from a FM pinned layer 37 by a tunnel barrier layer 39. SDT cell 26 includes a FM free layer 40 separated from a FM pinned layer 42 by a tunnel barrier layer 44. SDT cell 24 is connected to an electrically conductive read line 46 that is coupled to ground 50 by a transistor 48, which includes source region 52, drain region 54 and gate 56. Similarly, SDT cell 26 is connected to an electrically conductive read line 58 that is coupled to ground 50 by a transistor 60, which includes source region 62, drain region 54 and gate 66. Electrically conductive word line 75 controls the voltage on gate 56, and electrically conductive word line 77 controls the voltage on gate 66. Other read lines 80 and 82 exist for cells 20 and 22, respectively.

Electrically conductive digit line 70 is disposed adjacent to SDT cell 24 so that current flowing in digit line 70 and bit line 33 can change the magnetization direction of free layer 35, writing information to SDT cell 24, while transistor 48 is turned off. Similarly, electrically conductive digit line 72 is disposed adjacent to SDT cell 26 so that current flowing in digit line 72 and bit line 33 can change the magnetization direction of free layer 40, writing information to SDT cell 26, while transistor 60 is turned off.

The magnetic direction of free layer 35 relative to pinned layer 37 can act as a switch in determining whether electrons can tunnel through the barrier layer 39. When the magnetic moment of the free layer 35 is parallel to that of the pinned 37 layer electron tunneling is more likely than when the magnetic moment of the free layer is antiparallel to that of the pinned layer. This change in the amount of tunneling to an applied magnetic field may be termed magnetoresistance and can be measured as a change in current, resistance or voltage across the SDT device.

To read the information or state stored in SDT cell 24, transistor 48 is turned on and the voltage of bit line 33 indicates whether free layer 35 is parallel to or antiparallel to pinned layer 37. Even when free layer 35 and pinned layer 37 are parallel, resistance is encountered across tunnel barrier 39, and additional resistance may be present in bit line 33, read line 46 and transistor 48.

A figure of merit for a SDT device is the change in resistance divided by the resistance (AR/R) of the device in response to a change in applied magnetic field. For a MRAM device the MR is related to the voltage or logic levels that can be read with the device. Insufficient MR compared to required voltage levels could lead to errors, excessive current and/or power being usage and excessive heat generation.

SUMMARY

This invention can be regarded as a device including a spin-dependent tunneling cell including first and second ferromagnetic elements separated by a tunnel barrier layer, said first ferromagnetic element having a first magnetic moment and said second ferromagnetic element having a second magnetic moment, a first electrically conductive line that is disposed adjacent to one of said ferromagnetic elements and provides a magnetic field that changes a direction of said first magnetic moment relative to that of said second magnetic moment, and a second electrically conductive line that is electrically connected to at least one of said ferromagnetic elements to sense whether electrons can tunnel across said barrier layer, said second electrically conductive line being connected to a plurality of transistors in parallel.

This invention can also be regarded as a device including a plurality of spin-dependent tunneling cells each of which has a state that is one of a plurality of states, first and second electrically conductive lines that are disposed adjacent to one of said cells to change said state from a first state to a second state, and a third electrically conductive line that is electrically connected to said one cell to read said states, said third electrically conductive line being connected to a plurality of transistors in parallel.

This invention can also be regarded as a device including a plurality of spin-dependent tunneling cells each of which has a state that is one of a plurality of states, an electrically conductive bit line that is electrically connected to at least one of said cells, an electrically conductive digit line that is disposed adjacent to said one cell, such that electrical current flowing simultaneously in said bit line and said digit line changes said state of said one cell from a first state to a second state, and an electrically conductive read line that is

DETAILED DESCRIPTION OF THE PREFERRED EMBODIMENTS

Figure 1:
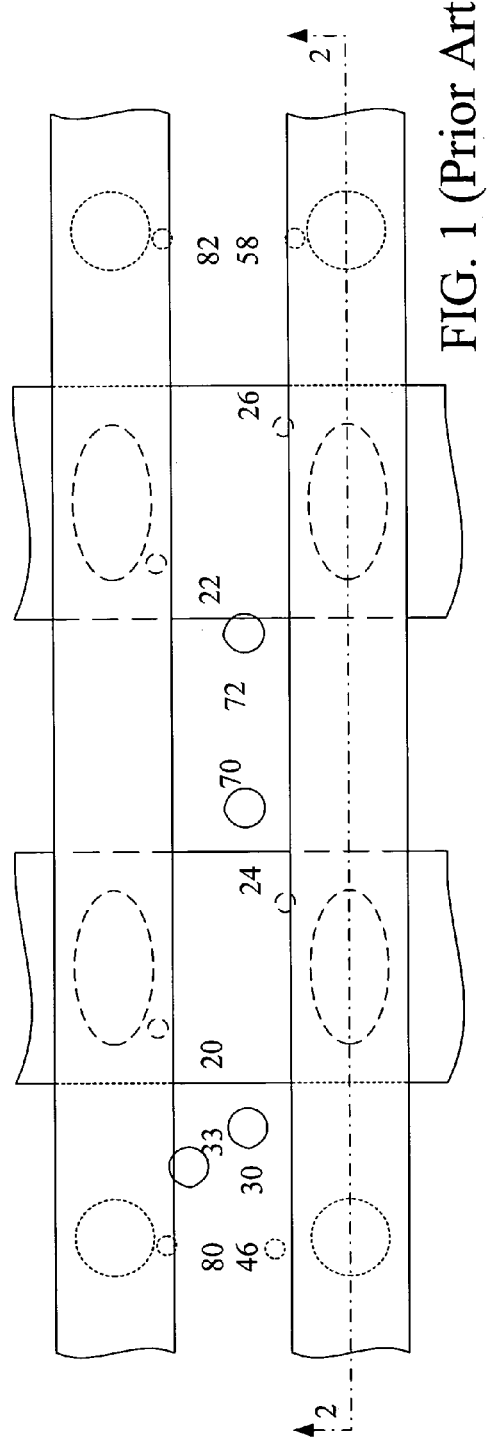
FIG. 1 is a top view of a conventional MRAM device.
Figure 2:
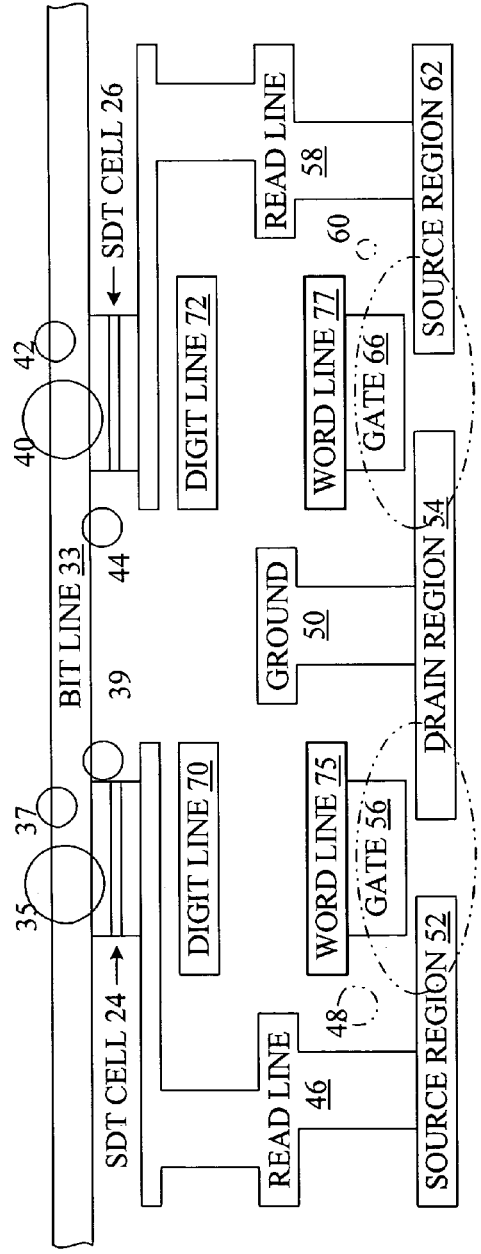
FIG. 2 is a cross-sectional view of the MRAM device of FIG. 1.
Figure 3:
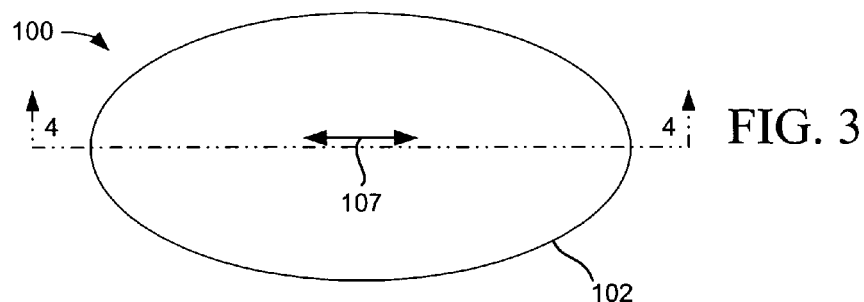
FIG. 3 is a top view of a first embodiment of a SDT cell in accordance with this invention.
Figure 4:
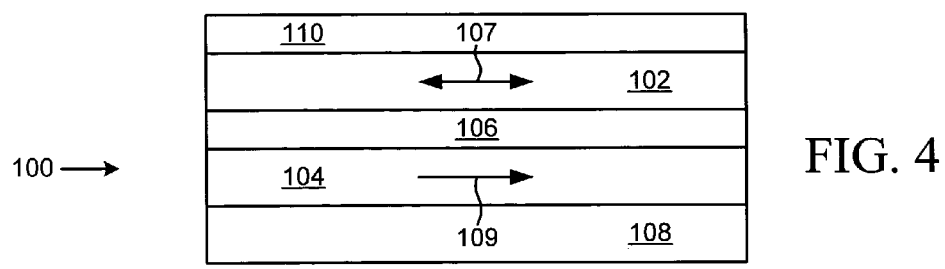
FIG. 4 is a cross-sectional view of the SDT cell of FIG. 3.

FIG. 3 is a top view and FIG. 4 is a cross-sectional view of a SDT device 100 including a tunnel barrier layer 106. The device includes a first FM layer 102 and second FM layer 104 separated by the tunnel barrier layer 106. A pinning structure 108 stabilizes a magnetic moment of the second FM layer 104. Other elements, such as an electrically conductive capping layer 110 may optionally be part of cell 100. In response to an applied magnetic field, the magnetic moment of the first FM layer 102 changes direction, as shown by arrow 107, while the magnetic moment of the second FM layer 104 is pinned, as shown by arrow 109. In this embodiment, which may for example be used in a MRAM device, an easy axis of magnetization of the first FM layer may be substantially parallel to the direction of magnetization of the second FM layer 104, so that the first FM layer switches between substantially parallel and substantially antiparallel states. As long as the easy axis of magnetization of the first FM layer 107 is more parallel than perpendicular, switching between two states is facilitated. The pinning structure 108 and pinned layer 104 can be formed before the free layer 102 as shown, or the pinning structure 108 and pinned layer 104 can be made after the free layer 102.

The pinning structure 108 may be an antiferromagnetic (AFM) layer that adjoins the pinned layer. The magnetic stabilization may be improved by using a synthetic AFM structure as the pinned layer. The synthetic AFM structure comprises a pair of FM layers exchange coupled across a thin transition metal layer. For example ruthenium (Ru) can be used in a sandwich of FM/Ru/FM in which the Ru layer has a thickness of about 8 Å. The magnetization direction of the pinned FM layer may be set upon deposition and annealing in a magnetic field. Additional magnetic biasing structures can optionally be provided, for example to reduce noise at edges of the free layer.

Either or both of the first and second FM layers can be made primarily or entirely of metals such as iron (Fe), cobalt (Co), nickel (Ni) or alloys of such metals. Either or both of the first and second FM layers may also be made of half-metallic magnets such as $CrO_2$, $Fe_3O_4$, PtMnSb, NiMnSb, $CO_2MnSi$ or $Sr_2FeMoO_6$. Either or both of the first and second FM layers may also be made of plural layers of metals or half-metallic magnets.

The thickness of a tunnel barrier layer, such as layer 106 or layer 206, can vary significantly for different embodiments, for example in a range between about 4 Å and about 20 Å. The increased ΔR/R response provided in accordance with this invention allows the spin dependent tunneling device to have a reduced area. The tunnel barrier layer 106 or 206 may itself be composed of plural dielectric layers with an oxidized or nitridized magnetic alloy or magnetic particles disposed in at least one of the dielectric layers.

Figure 5:
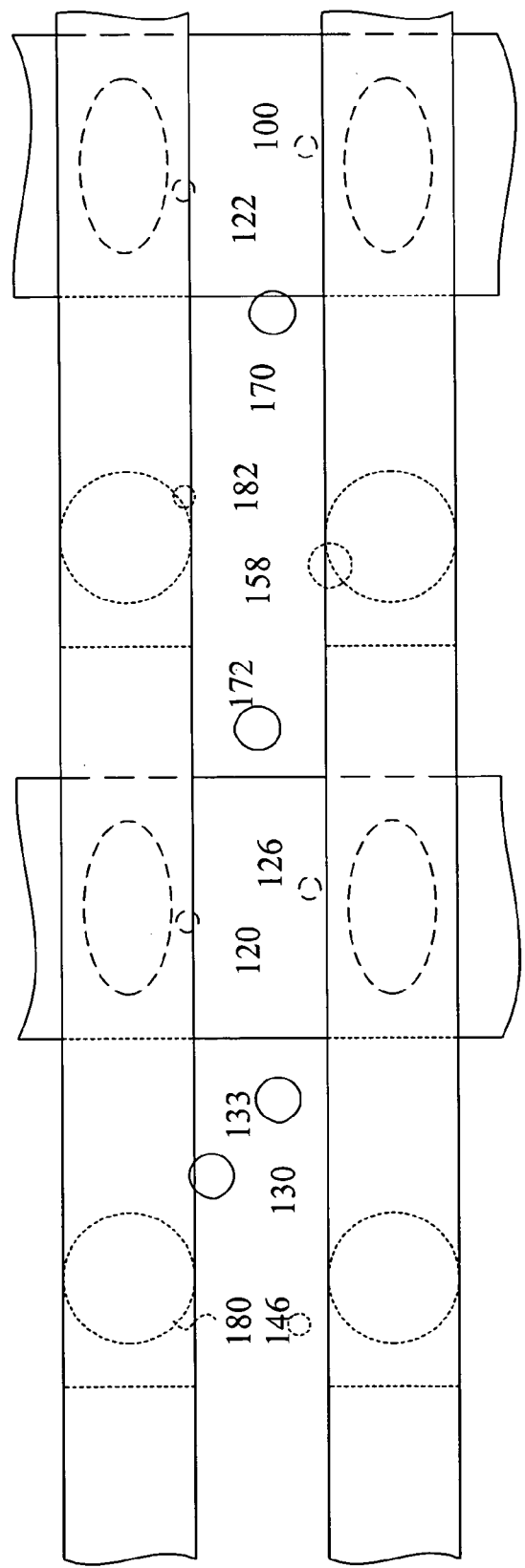
FIG. 5 is a top view of a MRAM device including the SDT cell of FIG. 3 and FIG. 4.
Figure 6:
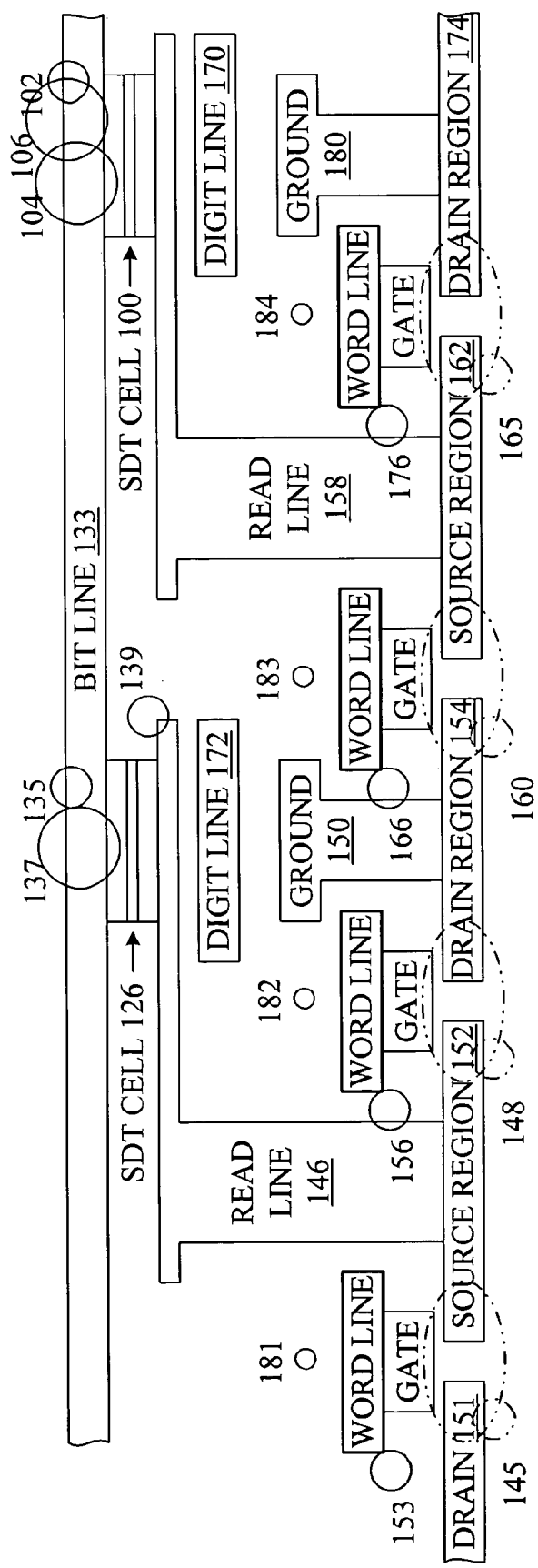
FIG. 6 is a cross-sectional view of the MRAM device of FIG. 5.

FIG. 5 shows a top view and FIG. 6 shows a cross-sectional view of a MRAM device including SDT cell 100. SDT cells 120 and 122 are connected to an electrically conductive bit line 130, and SDT cells 126 and 100 are connected to another electrically conductive bit line 133. SDT cell 126 includes a FM free layer 135 separated from a FM pinned layer 137 by a tunnel barrier layer 139. SDT cell 126 is connected to an electrically conductive read line 146 that is coupled to ground by both a first transistor 145 and a second transistor 148. First transistor 145 includes source region 152, drain region 151 and gate 153, with drain 151 coupled to ground. Second transistor 148 includes source region 152, drain region 154 and gate 156, with drain 154 coupled to ground line 150. First and second transistors in this example are field effect transistors (FETs), and more specifically are complementary metal-oxide silicon (CMOS) transistors.

Figure 7:
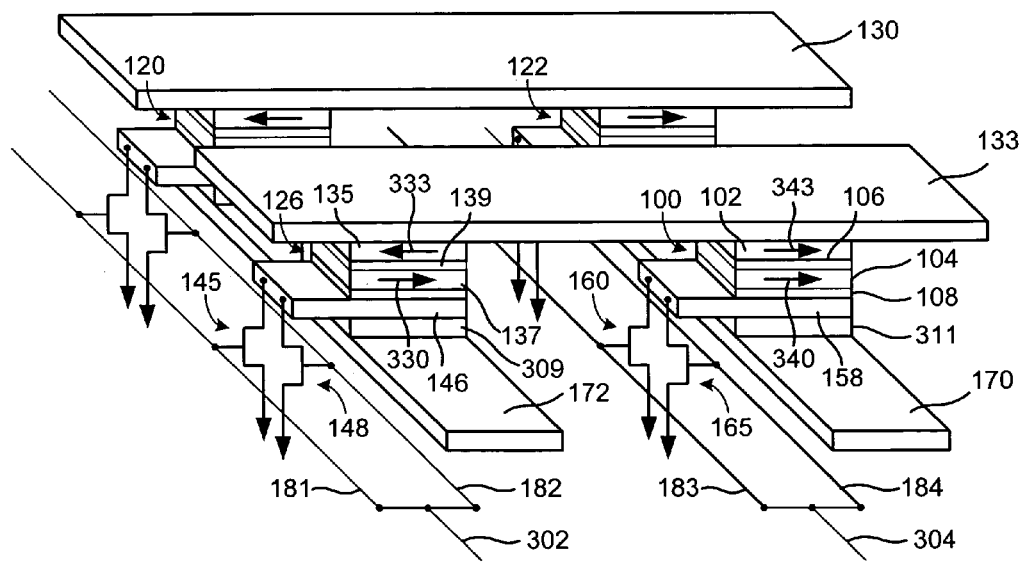
FIG. 7 is a schematic perspective view of the MRAM device of FIG. 5 and FIG. 6.

SDT cell 100 is connected to an electrically conductive read line 158 that is coupled to ground line 150 by a transistor 160, which includes source region 162, drain region 154 and gate 166. Read line 158 is also coupled to ground line 180 by a transistor 165, which includes source region 162, drain region 174 and gate 176. Although read line 158 is shown connected to two transistors, more or less transistors can couple read line 158 to ground. Coupling SDT cell 100 to plural transistors in parallel lowers the underlying resistance measured during reading, improving the ΔR/R. Word line 181 controls gate 153, word line 182 controls gate 156, word line 183 controls gate 166 and word line 184 controls gate 176. Word line 181 is connected to word line 182 to form word line 302, which is shown in FIG. 7. Similarly, word line 183 is connected to word line 184 to form word line 304, as shown in FIG. 7.

Electrically conductive digit line 170 is disposed adjacent to SDT cell 100 so that current flowing in digit line 170 and bit line 133 can change the magnetization direction of free layer 102, writing information to SDT cell 100, while transistors 160 and 165 are turned off. Similarly, electrically conductive digit line 172 is disposed adjacent to SDT cell 126 so that current flowing in digit line 172 and bit line 133 can change the magnetization direction of free layer 135, writing information to SDT cell 126, while transistors 145 and 148 are turned off.

To read the information or state stored in SDT cell 100, transistors 160 and 165 are turned on and the voltage of bit line 133 indicates whether free layer 102 is parallel to or antiparallel to pinned layer 104. Even when free layer 102 and pinned layer 104 are parallel, resistance is encountered across tunnel barrier 106, and additional resistance may be present in bit line 133, read line 158 and transistors 160 and 165. Providing transistors 160 and 165 in parallel to SDT cell 100 lowers this underlying resistance so that a change in resistance caused by SDT cell 100 switching between logical states is easier to detect.

FIG. 7 is a schematic perspective view of the solid-state MRAM device including SDT cells 100, 120, 122 and 126. More or less SDT cells may be present in a device such as an integrated circuit or chip that may be part of a memory module or integrated with logic or analog elements. Bit lines 130 and 133 are used for both reading and writing and are in electrical as well as magnetic communication with the cells. Digit lines 170 and 172 are used only for writing, and are in magnetic communication with cells 100 and 122, and with cells 120 and 126, respectively, but electrically isolated from those cells. Word lines 181, 182, 183 and 184 are in electrical communication with the cells via transistors, and are used only for reading.

Each of the SDT cells 100, 120, 122 and 126 includes a pinning layer and a pinned FM layer separated from a free FM layer by a tunnel barrier layer. Focusing on cells 100 and 126 provides an example for the operation of various cells. Cell 100 has pinned structure or layer 104, free layer 102 and a tunnel barrier layer 106. Transistors 145 and 148 controlled by word line 302 are coupled to read line 146. The conductive read line 146 is electrically isolated from digit line 172 by insulation layer 309. Similarly, cell 126 has pinned structure or layer 137, free layer 135 and a tunnel barrier layer 139. Transistors 160 and 165 controlled by word line 304 are coupled to read line 158. The conductive read line 158 is electrically isolated from digit line 172 by insulation layer 311.

Pinned layer 137 has a magnetic moment indicated by arrow 330, and free layer 135 has a magnetic moment indicated by arrow 333. A magnetic state is written to cell 126 by flowing current through lines 133 and 172 in an amount sufficient to switch the magnetic moment of the free layer 135. Current in line 133 creates a magnetic field along a hard axis of free layer 135 and current in line 172 creates a magnetic field along an easy axis of free layer 135, the combined fields being sufficient to switch the magnetic moment of the cell, whereas either field alone is insufficient to switch the cell. Arrow 333 is antiparallel to arrow 330, indicating that free layer 135 has a magnetic moment antiparallel to that of pinned layer 137. Turning on transistors 145 and 148 to sense the state of cell 126 would result in a high voltage state (when a constant current is applied) through the transistor, which may indicate for instance that a value of zero has been stored in cell 126.

Cell 100, on the other hand, has a free layer with a magnetic moment parallel to that of its pinned layer, as indicated by arrows 340 and 343. Turning on transistors 160 and 165 to sense the state of cell 100 would result in a low voltage state (when a constant current is applied) through the transistor, which may indicate for instance that a value of one has been stored in cell 100. It may also be possible for such SDT devices to have more than two distinct states or levels of resistance, allowing more information to be stored in each cell or MRAM module.

What is claimed is:

1. A device comprising:
   a spin-dependent tunneling cell including first and second ferromagnetic elements separated by a tunnel barrier layer, said first ferromagnetic element having a first magnetic moment and said second ferromagnetic element having a second magnetic moment;
   a first electrically conductive line that is disposed adjacent to one of said ferromagnetic element and provide a magnetic field that changes a direction of said first magnetic moment relative to that of said second magnetic moment; and
   a second electrically conductive line that is electrically connected to at least one of said ferromagnetic elements to sense electrons tunneling across said barrier layer, said second electrically conductive line being connected to a plurality of transistors in parallel, the plurality of transistors being configured to have a same state during a read operation.

2. The device of claim 1, wherein said first electrically conductive line is electrically connected to at least one of said ferromagnetic elements.

3. The device of claim 1, wherein said transistors share a source region.

4. The device of claim 1, wherein said second electrically conductive line includes an uninterrupted electrically conductive path between each of said transistors and said one of the ferromagnetic elements to which said second electrically conductive line is connected.

5. The device of claim 1, wherein said transistors are field effect transistors.

6. The device of claim 1, wherein said transistors are CMOS transistors.

7. The device of claim 1, wherein at least one of said ferromagnetic elements includes a half-metallic magnet.

8. The device of claim 1, further comprising a pinning structure coupled to said second ferromagnetic element to hold said second magnetic moment in a first direction.

9. The device of claim 1, further comprising a plurality of spin-tunneling cells connected to said first electrically conductive line.

10. A device comprising:
    a plurality of spin-dependent tunneling cells each of which has a state that is one of a plurality of states;
    a first and second electrically conductive lines that are disposed adjacent to one of said cells to change said state from a first state to a second state; and
    a third electrically conductive line that is electrically connected to said one cell to read said states, said third electrically conductive line being connected to a plurality of transistors in parallel, the plurality of transistors being configured to have a same state during a read operation.

11. The device of claim 10, wherein said first electrically conductive line is electrically connected to said one cell.

12. The device of claim 10, wherein said transistors share a source region.

13. The device of claim 10, wherein said third electrically conductive line includes an uninterrupted electrically conductive path between each of said transistors and said one cell.

14. The device of claim 10, wherein said transistors are field effect transistors.

15. The device of claim 10, wherein said transistors are CMOS transistors.

16. The device of claim 10, wherein each of said cells includes a ferromagnetic layer.

17. The device of claim 10, wherein each of said cells includes a half-metallic magnet.

18. The device of claim 10, wherein said first electrically conductive line is disposed adjacent to a set of said cells.

19. The device of claim 10, further comprising a plurality of spin-tunneling cells connected to said first electrically conductive line.

20. A device comprising:
    a plurality of spin-dependent tunneling cells each of which has a state that is one of a plurality of states;
    an electrically conductive bit line that is electrically connected to at least one of said cells;
    a electrically conductive digit line that is disposed adjacent to said one cells, such that electrical current flowing simultaneously in said bit line and said digit line changes said state of said one cell from a first state to a second state; and an electrically conductive read line that is electrically connected to said one cell and connected to a plurality of transistors in parallel, to read said state of said one cell when said transistors are all turned on.

21. The device of claim 20, wherein said transistors are each controlled by a word line.

22. The device of claim 20, wherein said transistors share a source region.

23. The device of claim 20, wherein said bit line extends in a first direction and said digit line extends in a second direction, said first and second directions being substantially perpendicular to each other.

24. The device of claim 20, wherein said transistors are field effect transistors.

25. The device of claim 20, wherein said transistors are CMOS transistors.

26. The device of claim 20, wherein each of said cells includes a ferromagnetic layer.

27. The device of claim 20, wherein each of said cells includes a half-metallic magnet.

28. The device of claim 1 wherein the plurality of transistors are coupled in parallel to an uninterrupted electrically conductive path to ground during the read operation.

29. The device of claim 10 wherein the plurality of transistors are coupled in parallel to an uninterrupted electrically conductive path to ground during the read operation.

30. The device of claim 20 wherein the plurality of transistors are coupled in parallel to an uninterrupted electrically conductive path to ground to read the state.

* * * * *